US006169311B1

United States Patent
Iwasaki

(10) Patent No.: US 6,169,311 B1
(45) Date of Patent: Jan. 2, 2001

(54) SEMICONDUCTOR INTEGRATED CIRCUIT HAVING AN INPUT AND OUTPUT PROTECTIVE CIRCUIT

(75) Inventor: Tadashi Iwasaki, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/179,412

(22) Filed: Oct. 27, 1998

(30) Foreign Application Priority Data

Oct. 27, 1997 (JP) .................................................. 9-294286

(51) Int. Cl.[7] .................................................. H01L 23/62
(52) U.S. Cl. .............................. 257/358; 257/357; 361/90
(58) Field of Search .................................... 257/357, 358; 361/90, 91, 92

(56) References Cited

FOREIGN PATENT DOCUMENTS

| | | |
|---|---|---|
| S52-95185 | 8/1977 | (JP) . |
| S63-56952 | 3/1988 | (JP) . |
| H3-278571 | 12/1991 | (JP) . |
| H5-218313 | 8/1993 | (JP) . |
| H6-244371 | 9/1994 | (JP) . |
| H7-202009 | 8/1995 | (JP) . |
| H8-139274 | 5/1996 | (JP) . |

*Primary Examiner*—David Hardy
(74) *Attorney, Agent, or Firm*—Sughrue, Mion, Zinn, Macpeak & Seas, PLLC

(57) ABSTRACT

Disclosed is a MOS-type semiconductor integrated circuit, which has: an input circuit section connected to an input pad; an output circuit section connected to an output pat; and an internal circuit section connected between the input circuit section and the output circuit section; wherein the input circuit section includes a first n-channel transistor, a first p-channel transistor and a first protective resistance connected between the first n-channel transistor and the first p-channel transistor, the input pad being connected between the first p-channel transistor and the first protective resistance, the internal circuit section being connected between the first n-channel transistor and the first protective resistance; and the output circuit section includes a second nchannel transistor, a second p-channel transistor and a second protective resistance connected between the second n-channel transistor and the second p-channel transistor, the output pad being connected between the second p-channel transistor and the second protective resistance, the internal circuit section being connected to the second n-channel transistor and the second p-channel transistor.

18 Claims, 9 Drawing Sheets

SEMICONDUCTOR INTEGRATED CIRCUIT HAVING AN INPUT AND OUTPUT PROTECTIVE CIRCUIT

FIELD OF THE INVENTION

This invention relates to a semiconductor integrated circuit, and more particularly to, a semiconductor integrated circuit composed to protect an input buffer from breakage caused by static discharge.

BACKGROUND OF THE INVENTION

In assembling a semiconductor device into a semiconductor package or transporting it, part of internal element of the semiconductor device may be deteriorated or broken by static discharge. To protect an integrated circuit from such damage, a semi-custom integrated circuit such as a gate array and a standard cell is often composed combining several common transistors in advance provided with input and output circuits including a static electricity protection function, without discriminating between input pad and output pad to facilitate the formation of LSI designing library.

A conventional CMOS (complementary metal-oxide semiconductor) type input and output circuit is, for example as shown in FIG.1, composed by, in advance, providing p-channel transistors 3, 4, 5 and 6 with same gate length and gate width and n-channel transistors 7, 8, 9 and 10 with same gate length and gate.

In an input circuit section 15, the p-channel transistors 3, 4 are connected between a power source line 16 and an input pad 1 and the n-channel transistors 7, 8 are connected between a ground line 17 and the input pad 1. The gate electrodes of the p-channel transistors 3, 4 are connected to the power source line 16, and the gate electrodes of the n-channel transistors 7, 8 are connected to the ground line 17.

The p-channel transistor 3 and the n-channel transistor 7 compose an input protective circuit 50, and the p-channel transistor 4 and the n-channel transistor 8 compose an input protective circuit 19.

Also, in an output circuit section 23, the p-channel transistors 5, 6 are connected between the power source line 16 and the output pad 2 and the n-channel transistors 9, 10 are connected between the ground line 17 and the output pad 2. The gate electrodes of the p-channel transistor 5 and the n-channel transistor 9 are connected to an internal circuit 20. The p-channel transistor 5 and the n-channel transistor 9 compose an output circuit 52.

The p-channel transistor 6 and the n-channel transistor 10, which do not contribute to the signal outputting from the internal circuit 20, compose an output protective circuit 53, like the input protective circuit.

With the above composition, the input and output circuit including the static electricity protection function can be efficiently realized.

In recent years, semiconductor integrated circuits have been increasingly provided with large capacity. Along with this, the operation speed has been enhanced. However, when the parasitic resistance of diffusion layer is reduced by silicidation or salicidation, where the diffusion layer for source electrode and drain electrode of transistor is covered with high-melting-point metal, to enhance the operation speed, static electricity stress may influence more directly the diffusion layer than ever. In particular, the drain part of the n-channel transistor is likely to be damaged.

To solve this, for example as shown in FIG. 2, a simple solution where resistance elements 11, 12, 13 and 14 are uniformly inserted to the drain parts of the n-channel transistors 7, 8, 9 and 10 can be easily imagined.

However, concerning the input circuit section 15, the placement of the resistance elements 11, 12 restricts current flow to the n-channel transistors 7, 8 thereby preventing the n-channel transistors 7, 8 from breaking down, the gate oxide film in the internal circuit 20 may be damaged before the protective circuit operates because the input pad 1 is directly connected to the gate electrodes of a p-channel transistor 21 and a n-channel transistor 22 inside the internal circuit 20.

A conventional technique to solve this problem is, for example, disclosed in Japanese patent application laid-open No. 9-97844 (1997), regarding an input protective circuit. As shown in FIG. 3, in the conventional input protective circuit 54, the p-channel transistor 3 is connected between the power source line 16 and the input pad 1, and the n-channel transistor 7 is connected between the ground line 17 and the input pad 1. The gate electrode of the p-channel transistor 3 is connected to the power source line 16, and the gate electrode of the n-channel transistor 7 is connected to the ground line 17. The n-well resistance 11 is inserted between the input pad 1 and the internal circuit 20.

Also, as another conventional technique, for example, Japanese patent application laid-open No. 9-97844 (1997) discloses an output protective circuit. As shown in FIG.4, in the conventional output protective circuit 55, the p-channel transistor 6 and the n-channel transistor 10 are connected in series, the source electrode of the p-channel transistor 6 is connected to the power source line 16, and the source electrode of the n-channel transistor 10 is connected to the ground line 17. The gate electrode of the p-channel transistor 6 is connected to the power source line 16, and the gate electrode of the n-channel transistor 10 is connected to the ground line 17. Further, the resistance element 13 is inserted between the input pad 2 and the connecting part of the p-channel transistor 6 and the n-channel transistor 10. The output protective circuit 55 is connected in parallel to the output circuit 24.

By the input protective circuit 54 in FIG. 3, the input protection in the internal circuit 20 can be surely performed. However, in the circuit composition in FIG.3, the n-channel transistor 7 itself cannot be prevented from breaking down because the n-channel transistor 7 as the protective element is, as mentioned earlier, directly connected to the input pad 1.

Also, if the circuit composition of the input protective circuit 54 is unalteredly applied to the output circuit as well, in particular, when outputting High level in a high drive output buffer, the resistivity of the n-well resistance element 11 becomes unnegligible and the output drive performance must be significantly deteriorated because the elemental performance of p-channel transistor is generally lower than that of n-channel transistor. When solving this, the layout area of the output p-channel transistor must be enlarged and therefore a circuit composition available for both the input circuit and the output circuit cannot be realized. Thus, it cannot be unalteredly applied to a gate array or a standard cell.

By the output protective circuit 55 in FIG.4, the static electricity protection of the output circuit can be performed without deteriorating the drive performance of the output circuit. However, in the circuit composition in FIG. 4, the n-channel transistor 9 itself cannot be prevented from breaking down because the n-channel transistor 9 is, as mentioned earlier, directly connected to the output pad 2. In particular, when the resistance element 13 is relatively large, the n-channel transistor 9 may become more likely to be broken down. It is very difficult to choose an optimum resistance value. Also, two kinds of circuit compositions, the output circuit 24 and the output protective circuit 55, have to be provided for one pad. Therefore, it is not multipurpose and cannot be unalteredly applied to a gate array or a standard cell.

SUMMARY OF THE INVENTION

Accordingly, it is an object of the invention to provide a semiconductor integrated circuit that can prevent the input buffer from breaking down by static discharge and can be easily applied to a semi-custom integrated circuit, such as a gate array and a standard cell.

According to the invention, a MOS-type semiconductor integrated circuit, comprises:

an input circuit section including an n-channel transistor, a p-channel transistor and a protective resistance connected between the n-channel transistor and the p-channel transistor;

wherein an input part is connected between the p-channel transistor and the protective resistance and an output part is connected between the n-channel transistor and the protective resistance.

According to another aspect of the invention, a MOS-type semiconductor integrated circuit, comprises:

an input circuit section connected to an input pad;

an output circuit section connected to an output pat; and an internal circuit section connected between the input circuit section and the output circuit section;

wherein the input circuit section includes a first n-channel transistor, a first p-channel transistor and a first protective resistance connected between the first n-channel transistor and the first p-channel transistor, the input pad being connected between the first p-channel transistor and the first protective resistance, the internal circuit section being connected between the first n-channel transistor and the first protective resistance; and the output circuit section includes a second n-channel transistor, a second p-channel transistor and a second protective resistance connected between the second n-channel transistor and the second p-channel transistor, the output pad being connected between the second p-channel transistor and the second protective resistance, the internal circuit section being connected to the second n-channel transistor and the second p-channel transistor.

BRIEF DESCRIPTION OF THE DRAWINGS

The invention will be explained in more detail in conjunction with the appended drawings, wherein.

DESCRIPTION OF THE PREFERRED EMBODIMENTS

Figure 5:
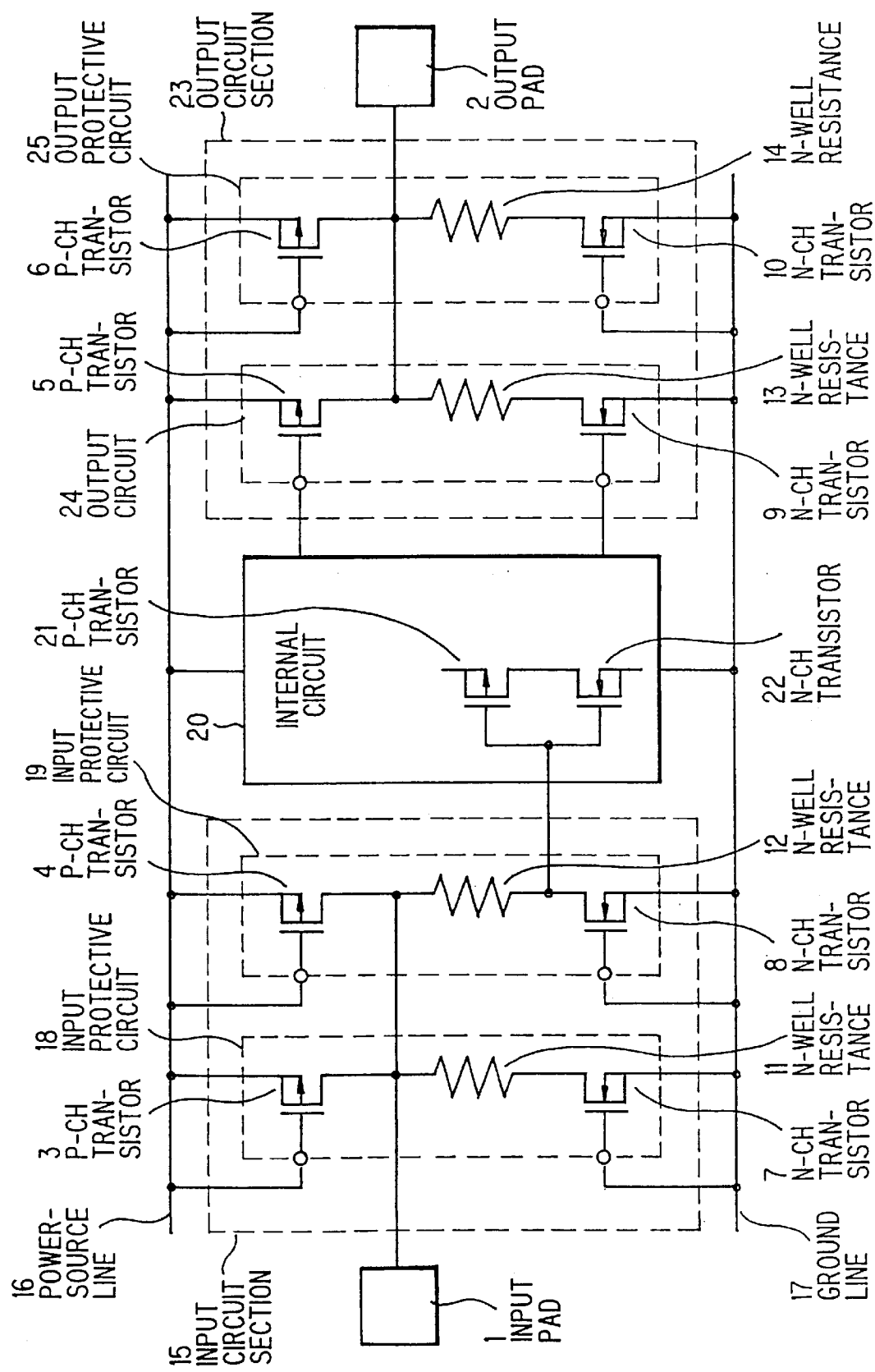
FIG. 5 is a circuit diagram showing a semiconductor integrated circuit in a first preferred embodiment according to the invention.

Next, the preferred embodiments according to the invention will be detailed referring to the drawing. FIG. 5 is a circuit diagram showing a semiconductor integrated circuit in the first preferred embodiment according to the invention.

In the first embodiment of the invention, the input and output circuit with the static electricity protection function is, for example as shown in FIG. 5, composed by in advance providing the p-channel transistors 3, 4, 5 and 6 with same gate length and gate width, the n-channel transistors 7, 8, 9 and 10 with same gate length and gate width, and the n-well resistance elements 11, 12, 13 and 14, for the input and output pads 1 and 2, and combining them.

In the input circuit section 15, the p-channel transistors 3 and 4 are connected between the power source line 16 and the input pad 1. The n-channel transistor 7 and the n-well resistance element 11 and the n-channel transistor 8 and the n-well resistance element 12, respectively, are connected in series between the ground line 17 and the input pad 1. The gate electrodes of the p-channel transistors 3, 4 are connected to the power source line 16, and the gate electrodes of the n-channel transistors 7, 8 are connected to the ground line 17.

The p-channel transistor 3, the n-channel transistor 7 and the n-well resistance element 11 compose the input protective circuit 18. Also, the p-channel transistor 4, the n-channel transistor 8 and the n-well resistance element 12 compose the input protective circuit 19.

The connection part between the n-channel transistor 8 and the n-well resistance element 12 in the input protective circuit 19 is connected to the input of the internal circuit 20, e.g., the gate electrode of the p-channel transistor 21 in the internal circuit 20 and the gate electrode of the n-channel transistor 22 in the internal circuit 20.

On the other hand, in the output circuit section 23, the p-channel transistors 5, 6 are connected between the power source line 16 and the output pad 2. The n-channel transistor 9 and the n-well resistance element 13 are connected in series between the ground line 17 and the output pad 2. The gate electrodes of the p-channel transistor 5 and the n-channel transistor 9 are connected to the internal circuit 20.

The p-channel transistor 5, the n-channel transistor 9 and the n-well resistance element 13 compose the output circuit 24. Also, the p-channel transistor 6, the n-channel transistor 10 and the n-well resistance element 14 compose the output protective circuit 25.

Next, the operation of this embodiment will be explained referring to FIG.5. For example, when a negative voltage to the ground line 17 is applied to the input pad 1 or the input pad 2, the n-channel transistors 7, 8, 9 and 10 break down through the resistance elements 11, 12, 13 and 14 and serve to lead an excess voltage to the ground line 17. In this case, by designing so that the break-down voltage of the n-channel transistor 12 becomes lower than that of the internal gate because the input of the internal circuit 20 is connected through the resistance element 12, the protective circuit can be surely operated before the gate oxide film of the internal circuit 20 is broken.

Figure 6:
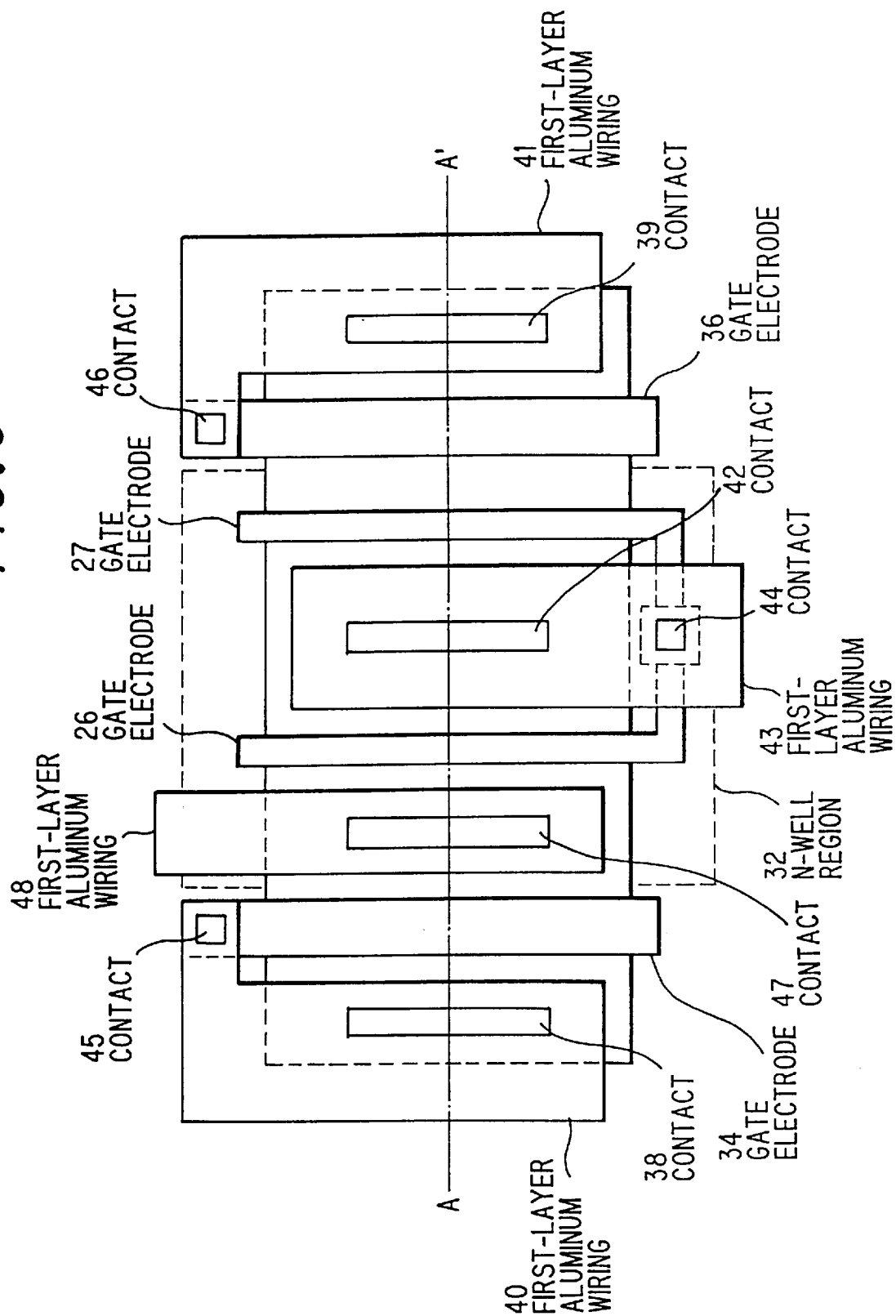
FIG. 6 is a layout diagram showing the semiconductor integrated circuit in the first embodiment.
Figure 7:
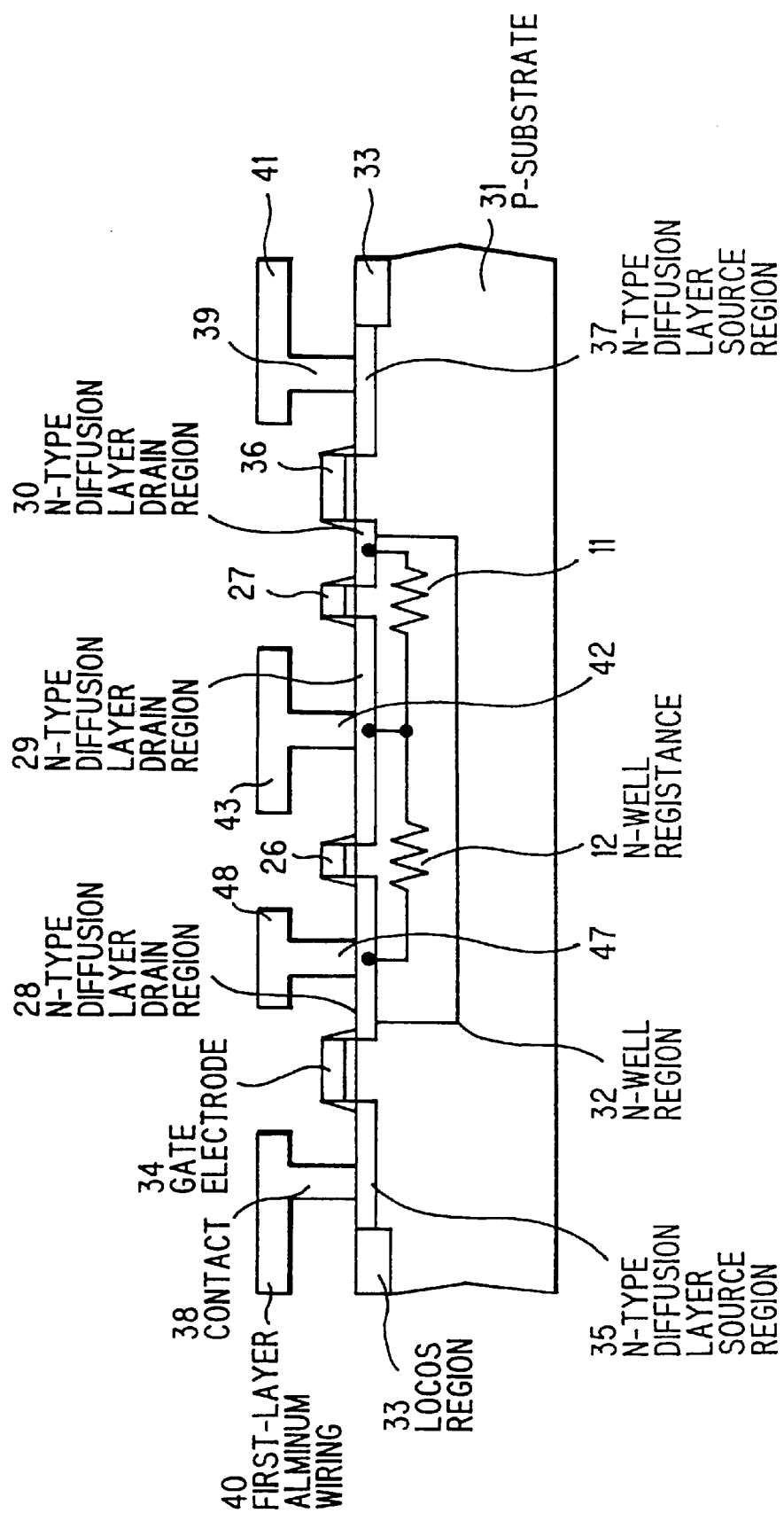
FIG. 7 is a cross section view cut along the line A–A' in FIG. 6.

FIG. 6 is a layout diagram showing the semiconductor integrated circuit in the first embodiment, and FIG. 7 is a cross sectional view cut along the line A–A' in FIG. 6.

Taken in this embodiment is an example that the silicide layer of n-type diffusion layer regions 28, 29 and 30 is separated by gate electrodes 26, 27 with a channel length of, e.g., 0.3 µm, the minimum size of semiconductor fabrication process, and the n-well resistance's 11, 12 are formed through a n-well region 32 introduced into a p-type substrate 31.

A device-forming region is formed by a LOCOS (local oxidation of silicon) region 33 on the p-type substrate 31. In the device-forming region, the n-channel transistor 8 is formed by a gate electrode 34, an n-type diffusion layer source region 35 and an n-type diffusion layer drain region 28. Also, the n-channel transistor 8 is formed by a gate electrode 36, an n-type diffusion layer source region 37 and an n-type diffusion layer drain region 30. The n-type diffusion layer source regions 35, 37 are connected through contacts 38, 39, respectively, and first-layer aluminum wirings 40, 41 to the ground line 17.

The drain regions 28, 30 of the n-channel transistors 7, 8 are connected in series to the n-well resistance's 11, 12, respectively, and are connected through a contact 42 and a first-layer aluminum wiring 43 to the input pad 1.

Also, the gate electrodes 26, 27 for separating the silicide layer are connected through a contact 44 to the first-layer aluminum wiring 43, and the gate electrodes 34, 36 of the n-channel transistors 7, 8 are connected through contacts 45, 46 and the first-layer aluminum wirings 40, 41 to the ground line 17. An input signal from the input protective circuit 12 is connected through the n-well resistance element 12, the drain region 28 of the n-channel transistor 8, a contact 47 and a first-layer aluminum wiring 48 to the internal circuit 20.

To compose the output protective circuit 25, the first-layer aluminum wiring 43 only has to be connected to the output pad 2 while disconnecting the contact 47 for connecting to the internal circuit 20.

To compose the output circuit 24, the gate electrodes 45, 46 only have to be further connected to the internal circuit 20. Thus, only by changing the wiring, an excellent input protective circuit can be easy provided.

Meanwhile, in FIGS. 6 and 7, a process after forming the interlayer insulating film is omitted.

Figure 8:
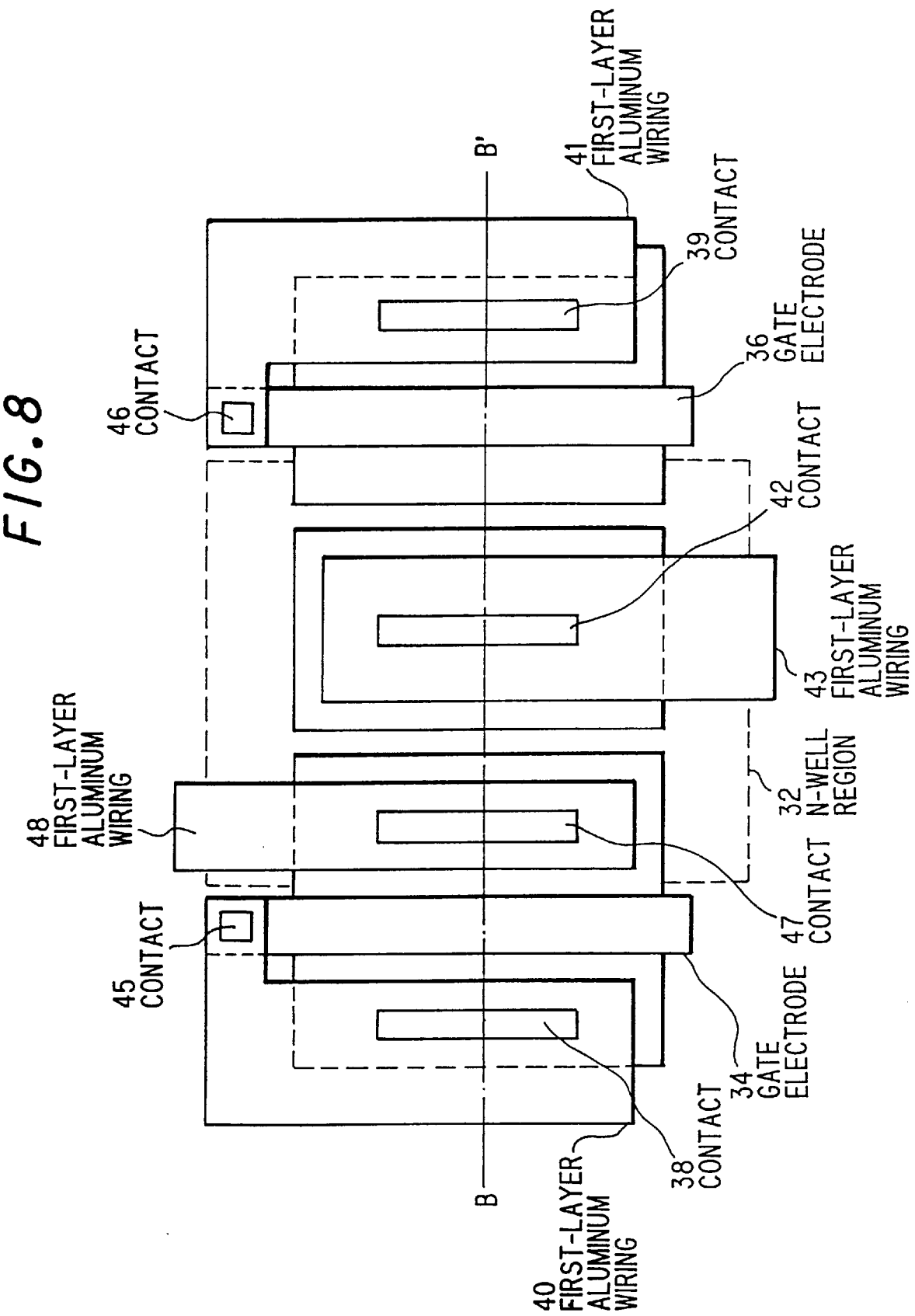
FIG. 8 is a layout diagram showing a semiconductor integrated circuit in a second preferred embodiment according to the invention.
Figure 9:
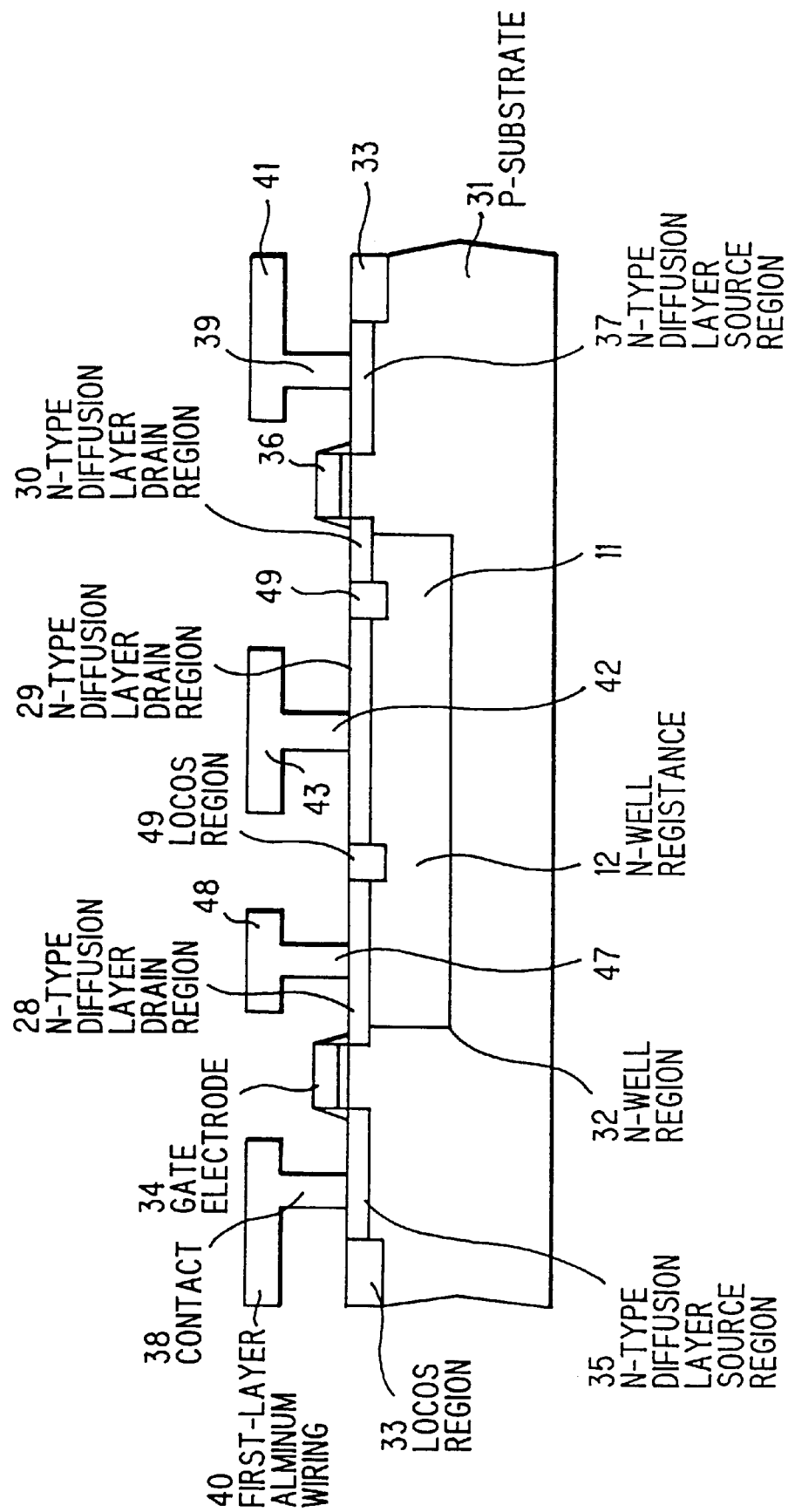
FIG. 9 is a cross section view cut along the line B–B' in FIG. 8.

FIG. 8 is a layout diagram showing a semiconductor integrated circuit in the second preferred embodiment according to the invention, and FIG. 9 is a cross sectional view cut along the line B–B' in FIG. 8.

The circuit composition and operation of the second embodiment are the same as the first embodiment. A specific component in the second embodiment will be explained in FIGS. 4 and 5.

Figure 1:
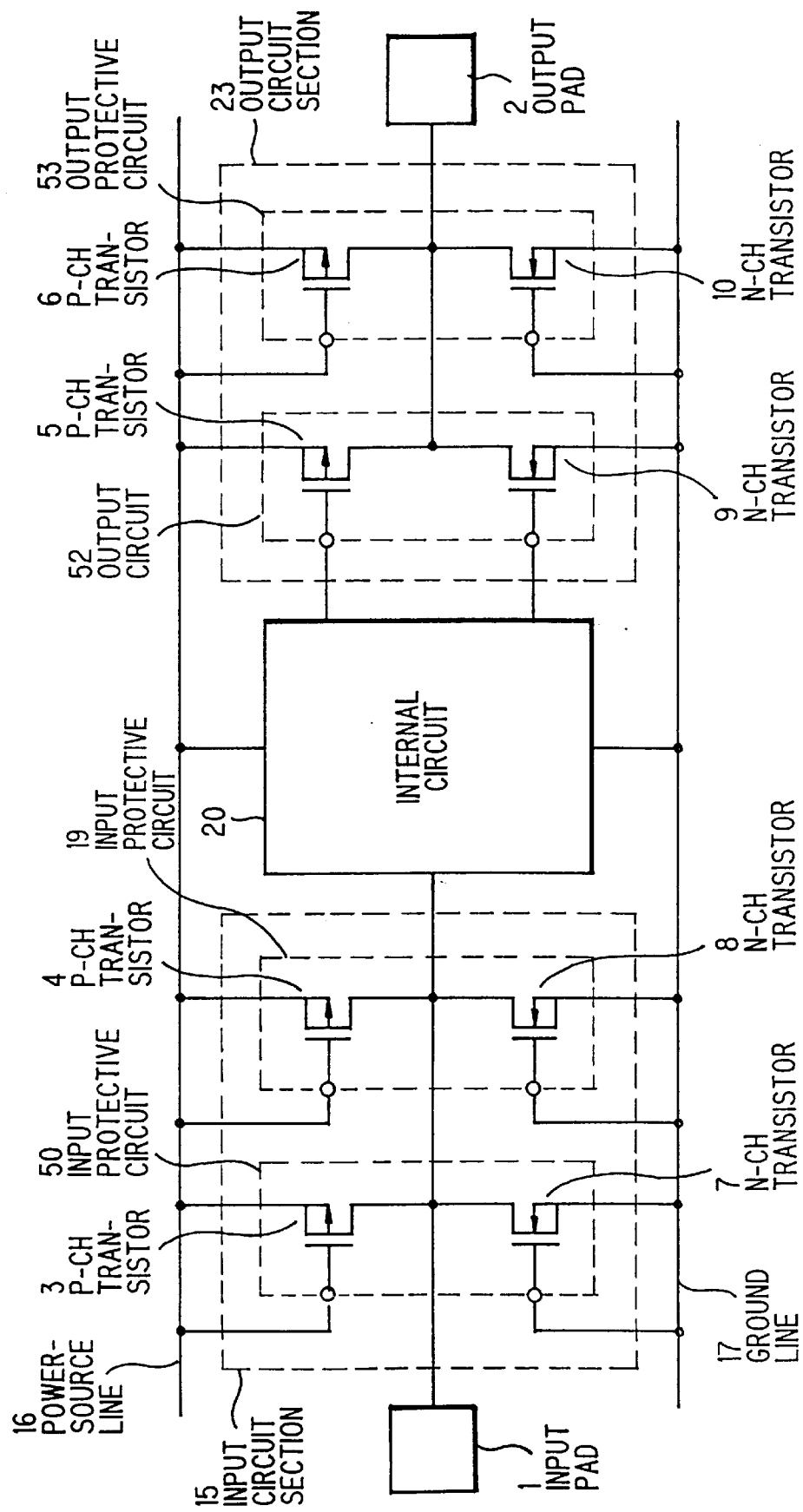
FIG. 1 is a circuit diagram showing an input and output circuit in a conventional semiconductor integrated circuit.
Figure 2:
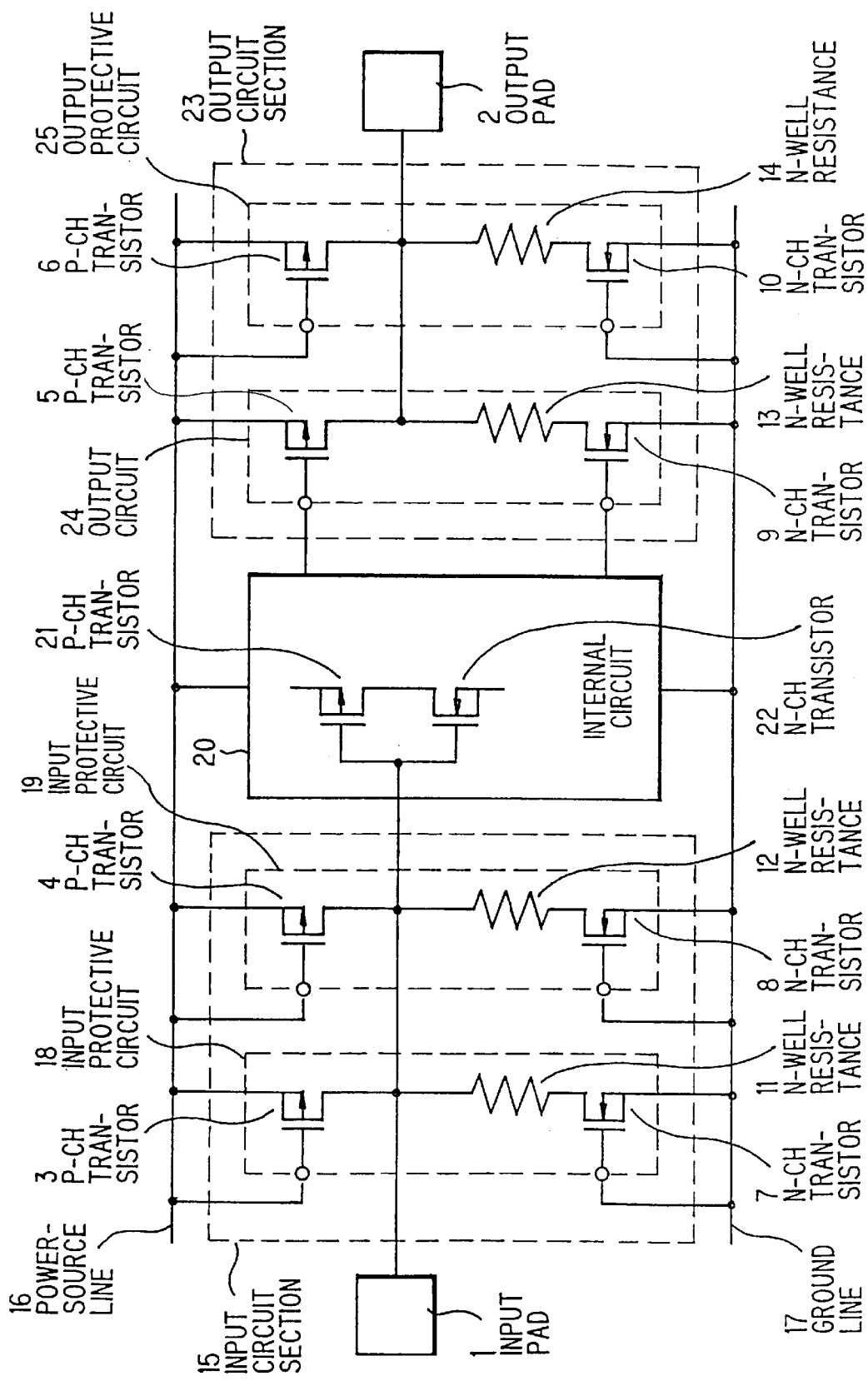
FIG. 2 is a circuit diagram for explaining a problem in the convention semiconductor integrated circuit.
Figure 3:
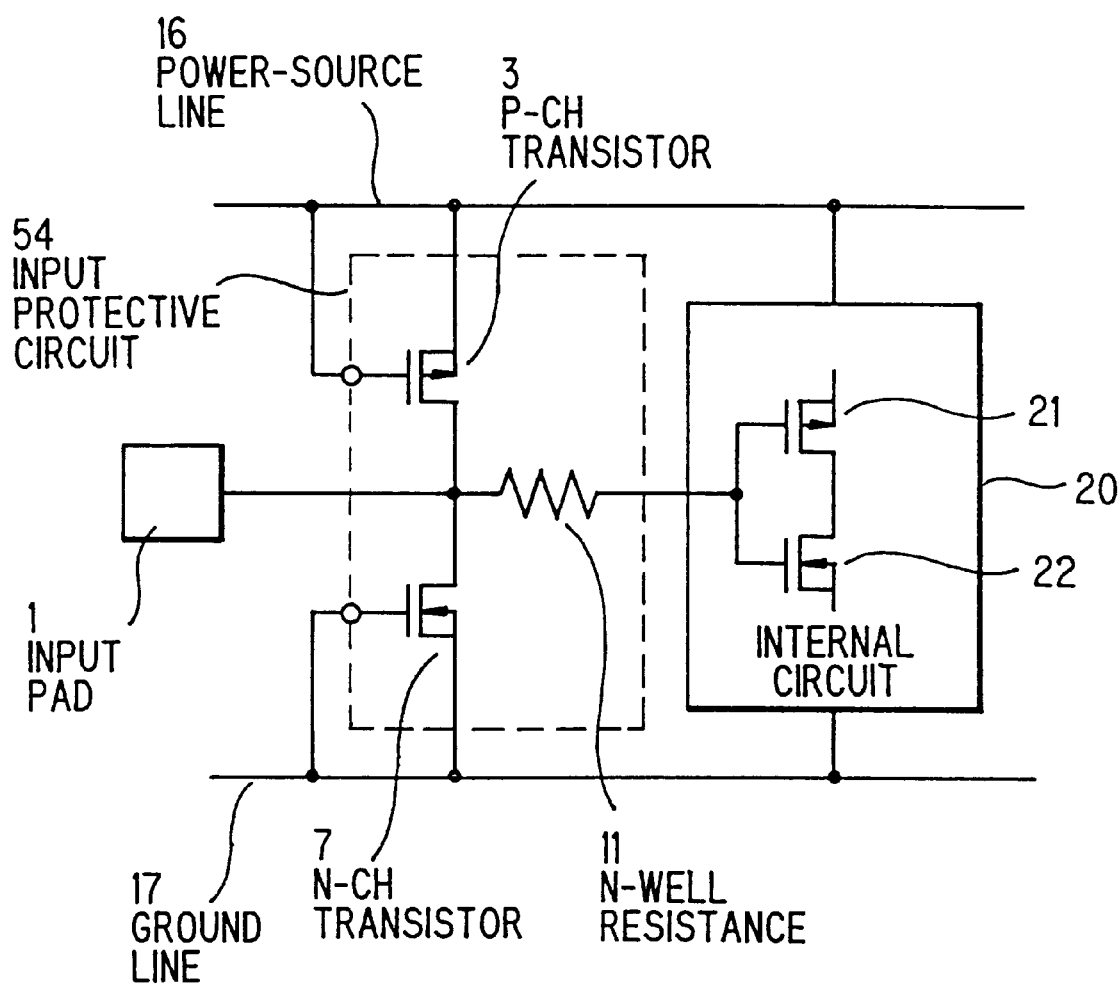
FIG. 3 is a circuit diagram showing an input circuit in another conventional semiconductor integrated circuit.
Figure 4:
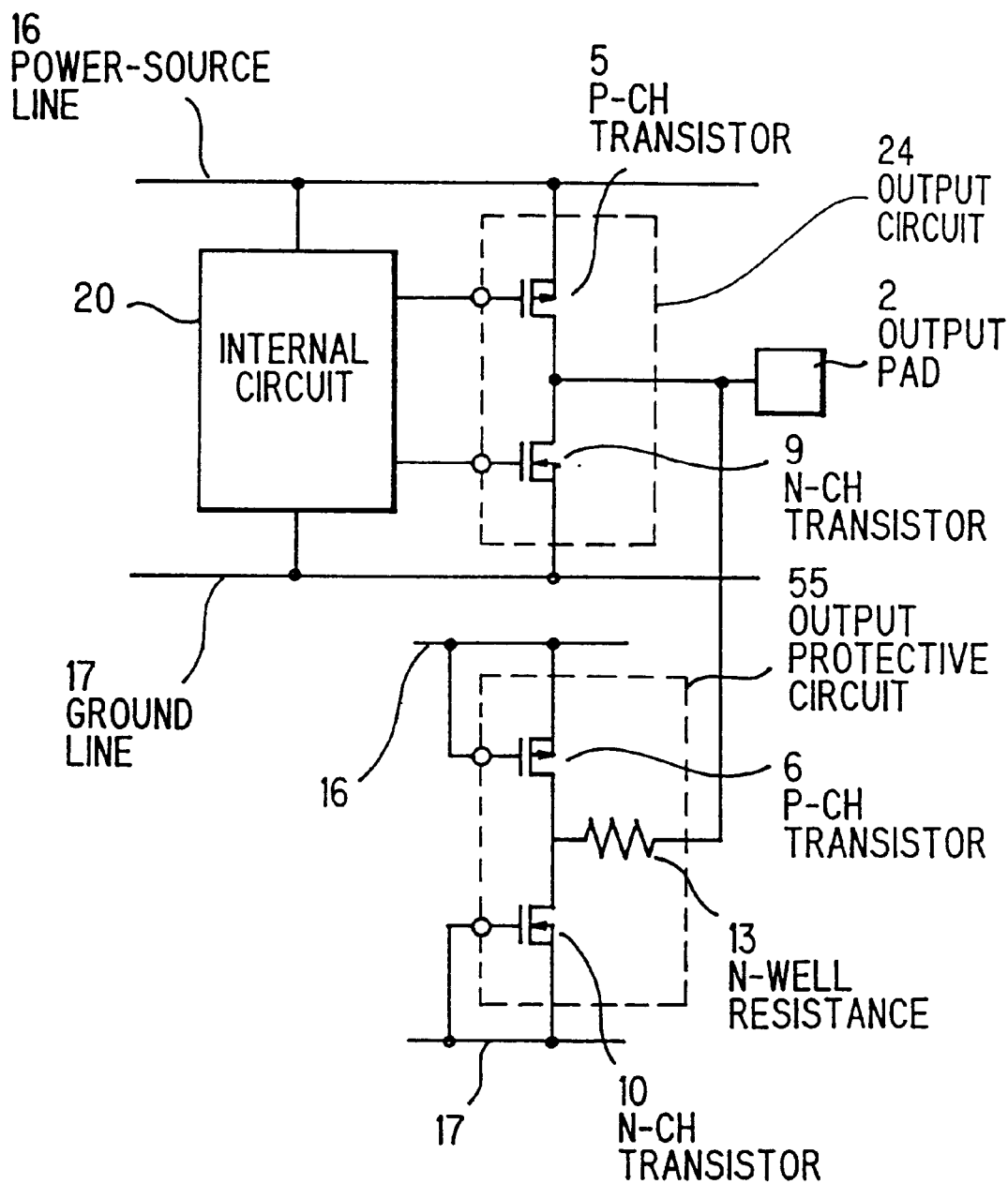
FIG. 4 is a circuit diagram showing an output circuit in still another conventional semiconductor integrated circuit.

As shown in FIG. 4, in the second embodiment, by LOCOS regions 49 to form the device region in place of the gate electrodes, the silicide layer of the n-type diffusion layer regions 28, 29 and 30 is separated. The n-well resistance's 11, 12 are formed through the n-well region 32 introduced in the p-type substrate 31. Meanwhile, the other components are same as the first embodiment.

Advantages of the Invention

In this invention, an input from outside is supplied through protective resistance to the internal circuit even when the static electricity break-down voltage of n-channel transistor is enhanced by the protective resistance and the n-channel transistor becomes hard to break down. Therefore, the protective circuit can operate before the gate oxide film etc. in the internal circuit breaks, thereby performing effectively the static electricity protection. As a result, the reliability of semiconductor integrated circuit can be enhanced.

Also, because of the circuit composition that can perform a static electricity protection function suitable to both the input circuit and the output circuit, the input and output circuit can be composed only by changing the wiring without enlarging the layout area. As a result, it can be easily applied to a semi-custom integrated circuit, such as a gate array and a standard cell.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A MOS-type semiconductor integrated circuit, comprising:

an input circuit section including an n-channel transistor, a p-channel transistor and a protective resistance connected between said n-channel transistor and said p-channel transistor;

wherein an input part is connected between said p-channel transistor and said protective resistance and an output part is connected between said n-channel transistor and said protective resistance.

2. A semiconductor integrated circuit, according to claim 1, wherein:

said p-channel transistor is connected between said input part and a power source line and said n-channel transistor is connected between said protective resistance and a ground line.

3. A semiconductor integrated circuit, according to claim 2, wherein:

said protective resistance is formed in a well region in a semiconductor substrate where a silicide layer of diffusion layer region is separated by a gate electrode formed on said semiconductor substrate.

4. A semiconductor integrated circuit, according to claim 2, wherein:

said protective resistance is formed in a well region in a semiconductor substrate where a silicide layer of diffusion layer region is separated by a LOCOS region formed on said semiconductor substrate.

5. A semiconductor integrated circuit, according to claim 1, wherein:

said protective resistance is formed in a well region in a semiconductor substrate where a silicide layer of diffusion layer region is separated by a gate electrode formed on said semiconductor substrate.

6. A MOS-type semiconductor integrated circuit, comprising:

an input circuit section connected to an input pad;

an output circuit section connected to an output pad; and an internal circuit section connected between said input circuit section and said output circuit section;

wherein said input circuit section includes a first n-channel transistor, a first p-channel transistor and a first protective resistance connected between said first n-channel transistor and said first p-channel transistor, said input pad being connected between said first p-channel transistor and said first protective resistance, said internal circuit section being connected between said first n-channel transistor and said first protective resistance; and said output circuit section includes a second n-channel transistor, a second p-channel transistor and a second protective resistance connected between said second n-channel transistor and said second p-channel transistor, said output pad being connected between said second p-channel transistor and said second protective resistance, said internal circuit section being connected to said second n-channel transistor and said second p-channel transistor.

7. A semiconductor integrated circuit, according to claim 6, wherein:
said protective resistance is formed in a well region in a semiconductor substrate where a silicide layer of diffusion layer region is separated by a LOCOS region formed on said semiconductor substrate.

8. A semiconductor integrated circuit, according to claim 6, wherein:
said first and second p-channel transistors and said internal circuit section are connected to a power source line; and
said first and second n-channel transistors and said internal circuit section are connected to a ground line.

9. A semiconductor integrated circuit, according to claim 8, wherein:
said input circuit section is connected to the gate electrode of a transistor in said internal circuit section.

10. A semiconductor integrated circuit, according to claim 9, wherein:
said protective resistance is formed in a well region in a semiconductor substrate where a silicide layer of diffusion layer region is separated by a gate electrode formed on said semiconductor substrate.

11. A semiconductor integrated circuit, according to claim 9, wherein:
said protective resistance is formed in a well region in a semiconductor substrate where a silicide layer of diffusion layer region is separated by a LOCOS region formed on said semiconductor substrate.

12. A semiconductor integrated circuit, according to claim 8, wherein:
said protective resistance is formed in a well region in a semiconductor substrate where a silicide layer of diffusion layer region is separated by a gate electrode formed on said semiconductor substrate.

13. A semiconductor integrated circuit, according to claim 8, wherein:
said protective resistance is formed in a well region in a semiconductor substrate where a silicide layer of diffusion layer region is separated by a LOCOS region formed on said semiconductor substrate.

14. A semiconductor integrated circuit, according to claim 6, wherein:
said input circuit section is connected to the gate electrode of a transistor in said internal circuit section.

15. A semiconductor integrated circuit, according to claim 14, wherein:
said protective resistance is formed in a well region in a semiconductor substrate where a silicide layer of diffusion layer region is separated by a gate electrode formed on said semiconductor substrate.

16. A semiconductor integrated circuit, according to claim 14, wherein:
said protective resistance is formed in a well region in a semiconductor substrate where a silicide layer of diffusion layer region is separated by a LOCOS region formed on said semiconductor substrate.

17. A semiconductor integrated circuit, according to claim 7, wherein:
said protective resistance is formed in a well region in a semiconductor substrate where a silicide layer of diffusion layer region is separated by a gate electrode formed on said semiconductor substrate.

18. A semiconductor integrated circuit, according to claim 1, wherein:
said protective resistance is formed in a well region in a semiconductor substrate where a silicide layer of diffusion layer region is separated by a LOCOS region formed on said semiconductor substrate.

* * * * *